(12) United States Patent  
Alapati et al.

(10) Patent No.: US 8,598,043 B2  
(45) Date of Patent: Dec. 3, 2013

(54) METHODS OF FORMING SEMICONDUCTOR CONSTRUCTIONS

(75) Inventors: Ramakanth Alapati, Boise, ID (US); Ardavan Niroomand, Boise, ID (US); Gurtej S. Sandhu, Boise, ID (US); Luan C. Tran, Meridian, ID (US)

(73) Assignee: Micron Technology Inc., Boise, ID (US)

( * ) Notice: Subject to any disclaimer, the term of this patent is extended or adjusted under 35 U.S.C. 154(b) by 347 days.

(21) Appl. No.: 12/886,459

(22) Filed: Sep. 20, 2010

(65) Prior Publication Data

US 2011/0008970 A1    Jan. 13, 2011

Related U.S. Application Data

(63) Continuation of application No. 11/402,659, filed on Apr. 11, 2006, now Pat. No. 7,799,694.

(51) Int. Cl.  
*H01L 21/302* (2006.01)

(52) U.S. Cl.  
USPC .......... 438/736; 438/714; 438/723; 438/735; 216/72

(58) Field of Classification Search  
USPC ............... 438/424, 435, 6, 37, 706, 710, 714, 438/720, 723, 735, 736, 787; 216/58, 72  
See application file for complete search history.

(56) References Cited

U.S. PATENT DOCUMENTS

| | | |
|---|---|---|
| 4,356,211 A | 10/1982 | Riseman |
| 4,472,240 A | 9/1984 | Kameyama |
| 4,533,430 A | 8/1985 | Bower |
| 4,639,288 A | 1/1987 | Price et al. |
| 4,825,277 A | 4/1989 | Mattox et al. |
| 5,021,846 A | 6/1991 | Ueno |
| 5,801,083 A * | 9/1998 | Yu et al. .................. 438/424 |
| 5,872,045 A | 2/1999 | Lou et al. |

(Continued)

FOREIGN PATENT DOCUMENTS

| | | |
|---|---|---|
| FR | 2826179 | 12/2002 |
| JP | 2206175 | 8/1990 |

(Continued)

OTHER PUBLICATIONS

Hong et al., "A Novel T-Shaped Shallow Trench Isolation Technology", Apr. 2001, The Japan Society of Applied Physics.

(Continued)

*Primary Examiner* — Lan Vinh  
(74) *Attorney, Agent, or Firm* — Wells St. John P.S.

(57) ABSTRACT

The invention includes methods of forming isolation regions for semiconductor constructions. A hard mask can be formed and patterned over a semiconductor substrate, with the patterned hard mask exposing a region of the substrate. Such exposed region can be etched to form a first opening having a first width. The first opening is narrowed with a conformal layer of carbon-containing material. The conformal layer is punched through to expose substrate along a bottom of the narrowed opening. The exposed substrate is removed to form a second opening which joins to the first opening, and which has a second width less than the first width. The carbon-containing material is then removed from within the first opening, and electrically insulative material is formed within the first and second openings. The electrically insulative material can substantially fill the first opening, and leave a void within the second opening.

20 Claims, 10 Drawing Sheets

(56) References Cited

U.S. PATENT DOCUMENTS

| | | | |
|---|---|---|---|
| 5,928,428 A | 7/1999 | Horie | |
| 5,930,595 A | 7/1999 | Sridhar et al. | |
| 5,945,707 A | 8/1999 | Bronner et al. | |
| 6,121,082 A | 9/2000 | Linliu et al. | |
| 6,150,212 A | 11/2000 | Divakaruni et al. | |
| 6,214,698 B1 | 4/2001 | Liaw et al. | |
| 6,265,281 B1 | 7/2001 | Reinberg | |
| 6,277,709 B1 | 8/2001 | Wang et al. | |
| 6,322,634 B1 | 11/2001 | Pan | |
| 6,376,893 B1 | 4/2002 | Rha | |
| 6,383,877 B1 | 5/2002 | Ahn et al. | |
| 6,432,843 B1 | 8/2002 | Kim et al. | |
| 6,437,417 B1 | 8/2002 | Gilton | |
| 6,445,072 B1 | 9/2002 | Subramanian et al. | |
| 6,518,641 B2 | 2/2003 | Mandelman et al. | |
| 6,541,825 B2 | 4/2003 | Kuroi et al. | |
| 6,562,696 B1* | 5/2003 | Hsu et al. | 438/424 |
| 6,566,299 B1 | 5/2003 | Spivack et al. | |
| 6,596,607 B2 | 7/2003 | Ahn | |
| 6,617,662 B2 | 9/2003 | Park | |
| 6,620,681 B1 | 9/2003 | Kim et al. | |
| 6,624,496 B2 | 9/2003 | Ku et al. | |
| 6,627,529 B2 | 9/2003 | Ireland | |
| 6,683,354 B2 | 1/2004 | Heo et al. | |
| 6,693,050 B1 | 2/2004 | Cui et al. | |
| 6,727,150 B2 | 4/2004 | Tang | |
| 6,753,569 B2 | 6/2004 | Lin et al. | |
| 6,780,721 B2 | 8/2004 | Farrar | |
| 6,791,155 B1 | 9/2004 | Lo et al. | |
| 6,841,440 B2 | 1/2005 | Kuroi et al. | |
| 6,867,098 B2 | 3/2005 | Park et al. | |
| 6,897,120 B2 | 5/2005 | Trapp | |
| 7,038,289 B2 | 5/2006 | Marty et al. | |
| 7,105,397 B2 | 9/2006 | Hieda et al. | |
| 7,122,416 B2 | 10/2006 | Nevin et al. | |
| 7,196,396 B2 | 3/2007 | Ohta | |
| 7,208,812 B2 | 4/2007 | Ohta | |
| 7,279,377 B2 | 10/2007 | Rueger et al. | |
| 7,332,408 B2 | 2/2008 | Violette | |
| 7,332,789 B2 | 2/2008 | Violette | |
| 7,439,157 B2 | 10/2008 | Bian et al. | |
| 7,799,694 B2* | 9/2010 | Alapati et al. | 438/714 |
| 2002/0038901 A1 | 4/2002 | Kuroi et al. | |
| 2002/0055205 A1 | 5/2002 | Lin et al. | |
| 2002/0090795 A1 | 7/2002 | Ahn et al. | |
| 2002/0146914 A1 | 10/2002 | Huang et al. | |
| 2002/0160579 A1 | 10/2002 | Kim | |
| 2002/0171118 A1 | 11/2002 | Mandelman et al. | |
| 2003/0143810 A1 | 7/2003 | Kuroi et al. | |
| 2003/0207579 A1 | 11/2003 | Rattner et al. | |
| 2004/0018695 A1* | 1/2004 | Tang | 438/427 |
| 2004/0029389 A1 | 2/2004 | Lo | |
| 2004/0097077 A1 | 5/2004 | Nallan et al. | |
| 2004/0102031 A1 | 5/2004 | Kloster et al. | |
| 2004/0147093 A1 | 7/2004 | Marty et al. | |
| 2004/0161919 A1* | 8/2004 | Cha et al. | 438/618 |
| 2004/0224510 A1 | 11/2004 | Sandhu et al. | |
| 2004/0232496 A1 | 11/2004 | Chen et al. | |
| 2004/0235240 A1 | 11/2004 | Hsu et al. | |
| 2005/0090061 A1 | 4/2005 | Rudeck et al. | |
| 2005/0112843 A1 | 5/2005 | Fischer et al. | |
| 2005/0161729 A1 | 7/2005 | Dong et al. | |
| 2005/0287731 A1 | 12/2005 | Bian et al. | |
| 2006/0043455 A1 | 3/2006 | Batra et al. | |
| 2006/0154477 A1* | 7/2006 | Geng et al. | 438/637 |
| 2006/0255426 A1 | 11/2006 | Inoue et al. | |
| 2007/0045769 A1 | 3/2007 | Bian et al. | |
| 2007/0059897 A1* | 3/2007 | Tilke et al. | 438/424 |
| 2007/0103118 A1 | 5/2007 | Takagi et al. | |
| 2007/0170528 A1 | 7/2007 | Partridge et al. | |
| 2007/0235783 A9 | 10/2007 | Sandhu et al. | |
| 2008/0105906 A1 | 5/2008 | Mori et al. | |
| 2008/0128781 A1 | 6/2008 | Violette | |

FOREIGN PATENT DOCUMENTS

| | | |
|---|---|---|
| JP | 8213392 | 8/1996 |
| JP | 2000-357733 | 12/2000 |
| JP | 2002-043413 | 2/2002 |
| JP | 2002-319638 | 10/2002 |
| JP | 2002/368076 | 12/2002 |
| JP | 2004-531070 | 10/2004 |
| JP | 2005-160251 | 6/2005 |
| JP | 2006-80026433.8 | 12/2011 |
| KR | 1020000045372 | 7/2000 |
| KR | 2000-0075409 | 12/2000 |
| KR | 1020010036818 | 5/2001 |
| KR | 1020010073704 | 8/2001 |
| KR | 2002-0027161 | 4/2002 |
| WO | WO85/03041 | 12/1984 |
| WO | PCT/US06/026692 | 8/2006 |
| WO | PCT/US06/026692 | 5/2008 |

OTHER PUBLICATIONS

Shin et al., "Data Retention Time and Electrical Characteristics of Cell Transistor According to STI Materials in 90 nm DRAM", Journal of the Korean Physical Society, vol. 43, No. 5, pp. 887-891, Nov. 2003.

Bian et al.; Final Office Action for 7,439,157 (Apr. 16, 2008).

Bian et al.; Non-Final Office Action for 7,493,157 (Oct. 15, 2007).

Bian et al.; Response to Oct. 15, 2007 Office Action for 7,439,157 (Jan. 8, 2008).

* cited by examiner

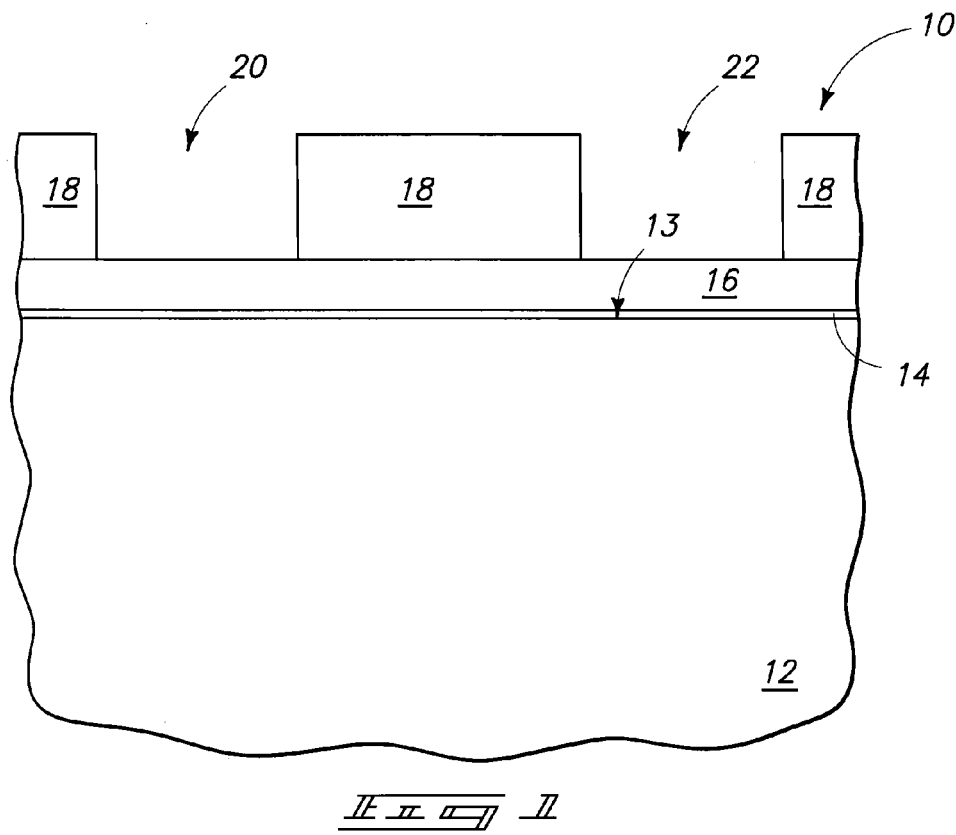
_Fig. 1_
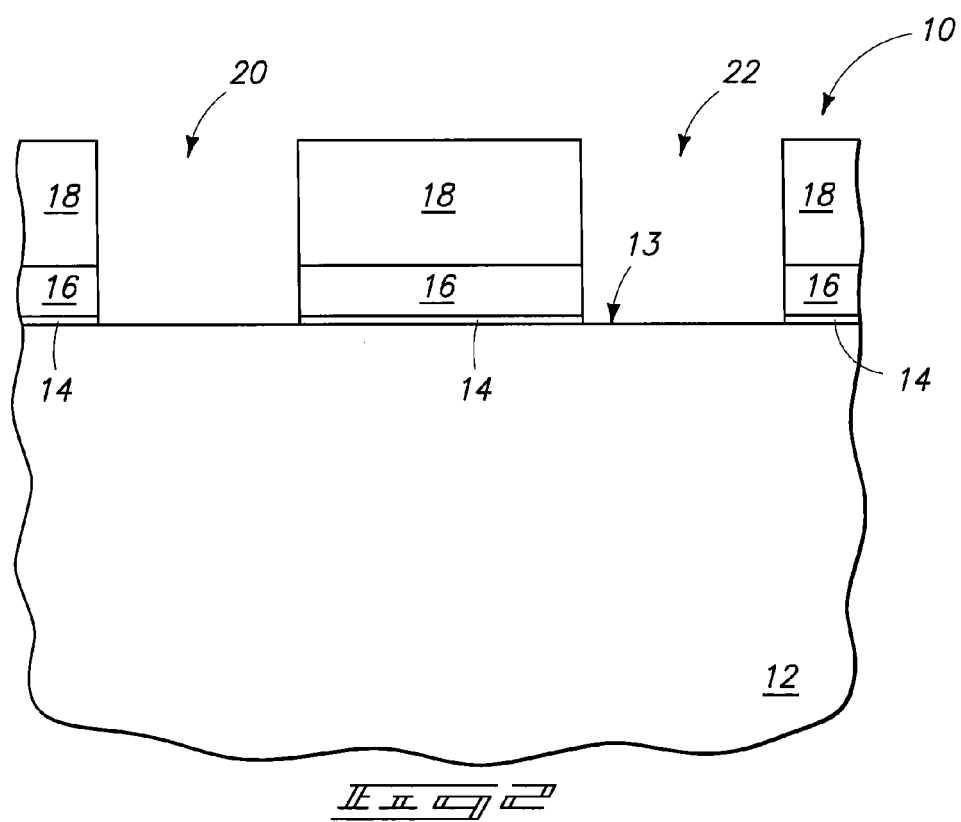
_Fig. 2_

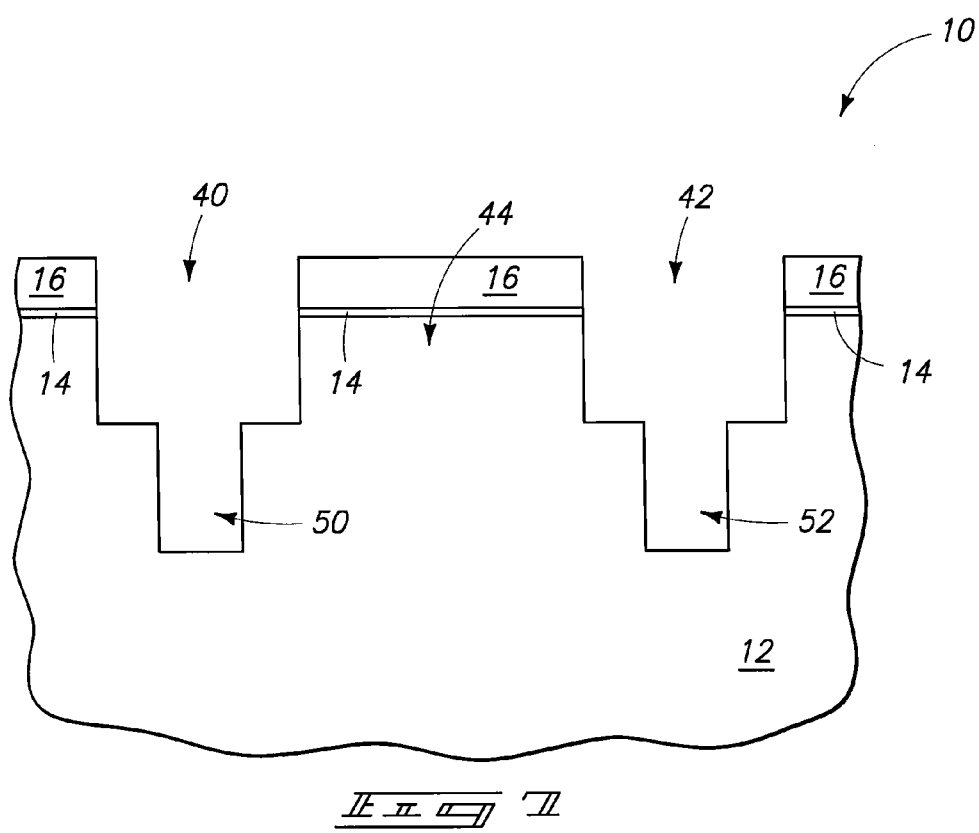
_Fig. 7_
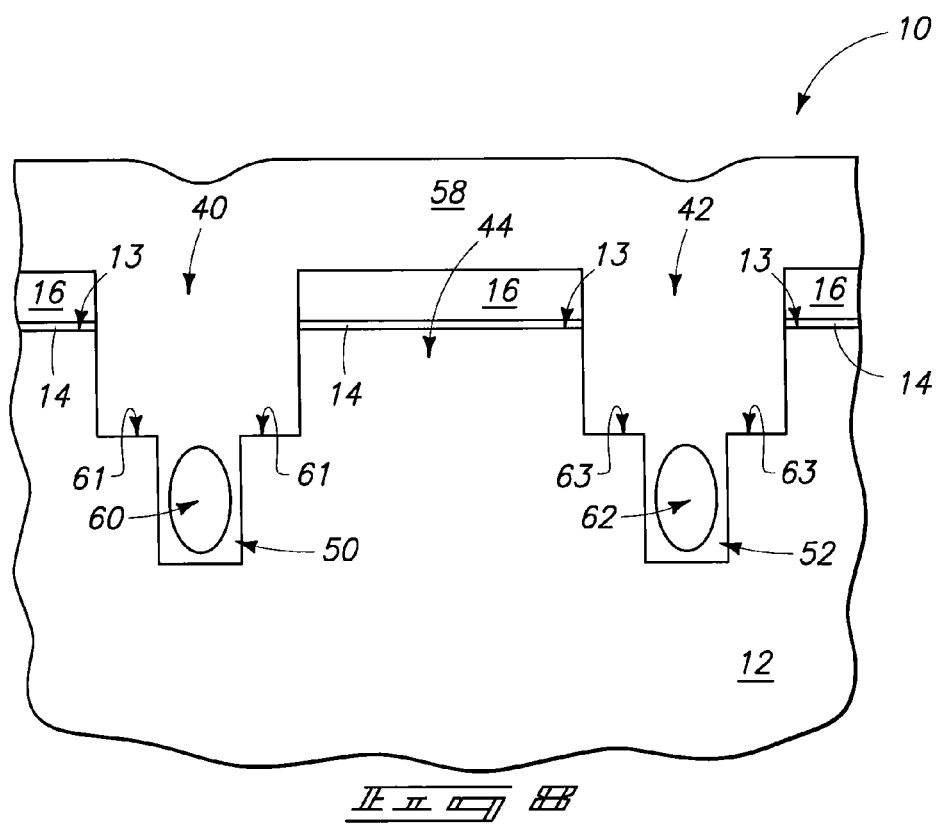
_Fig. 8_

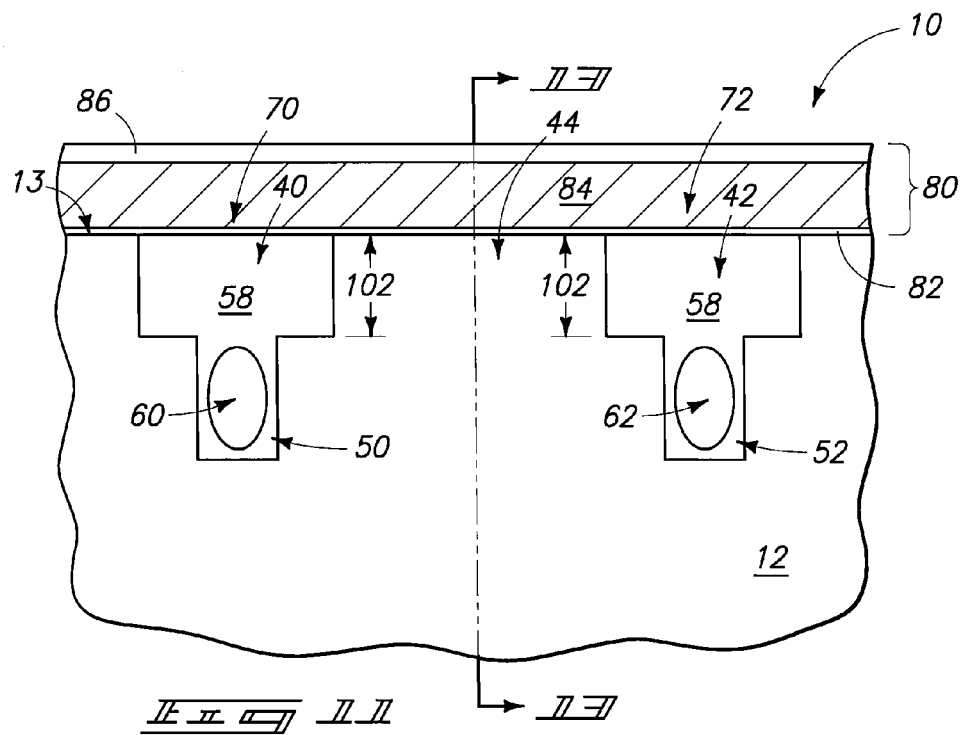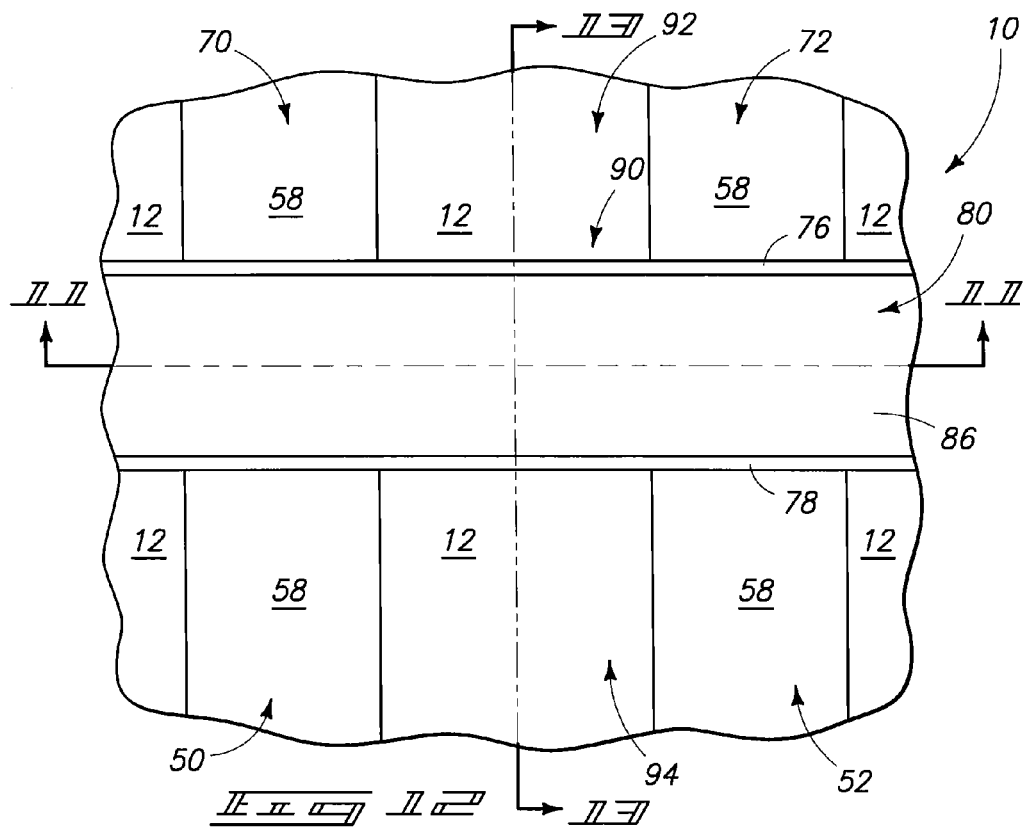

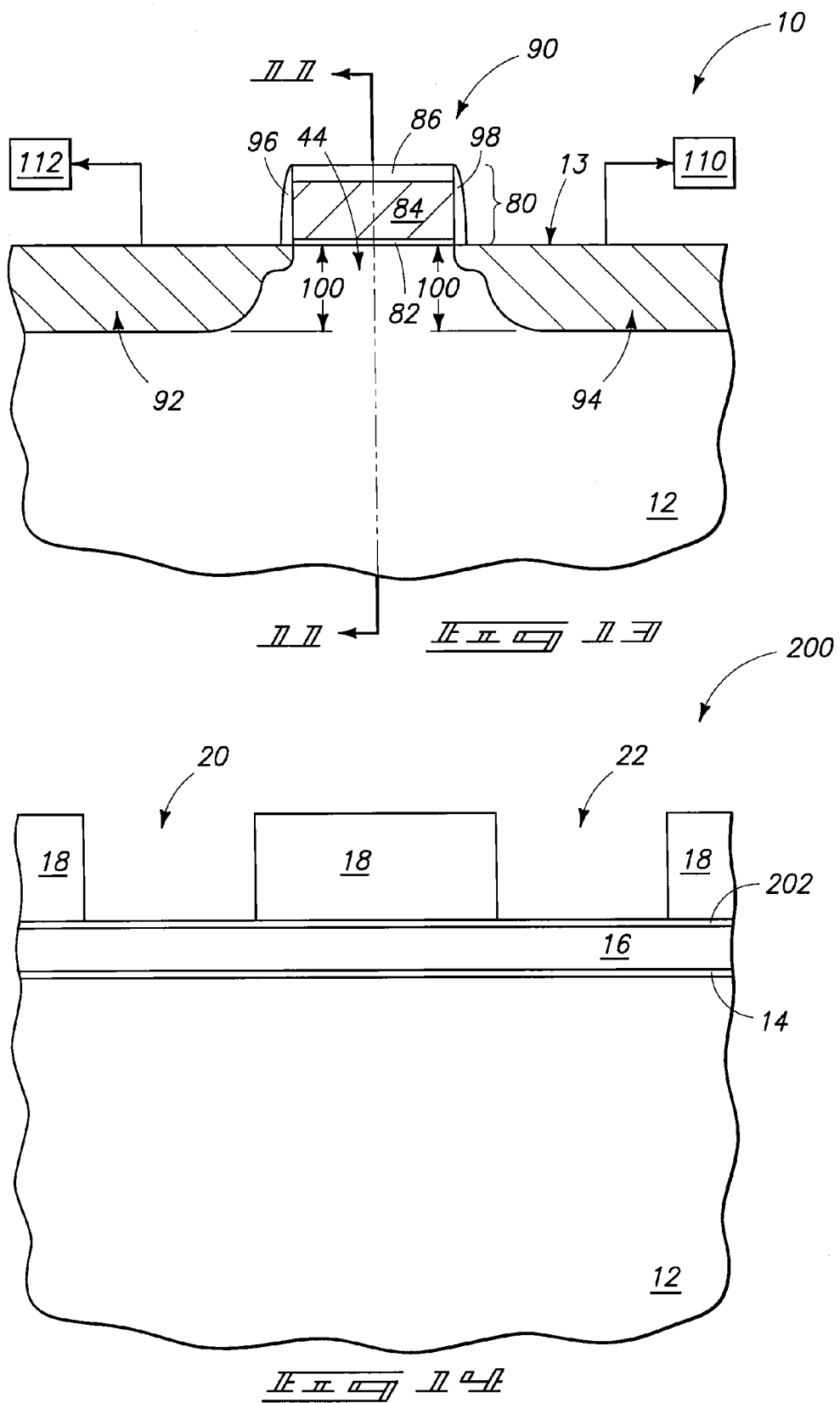

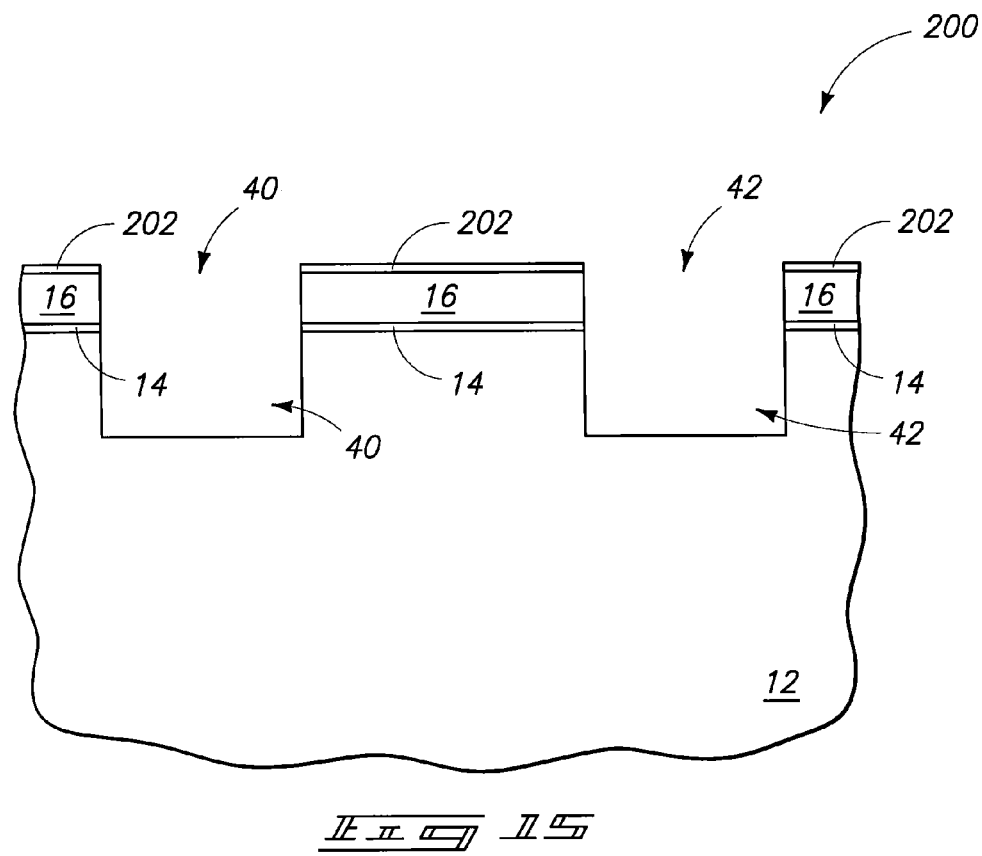
_Fig. 15_
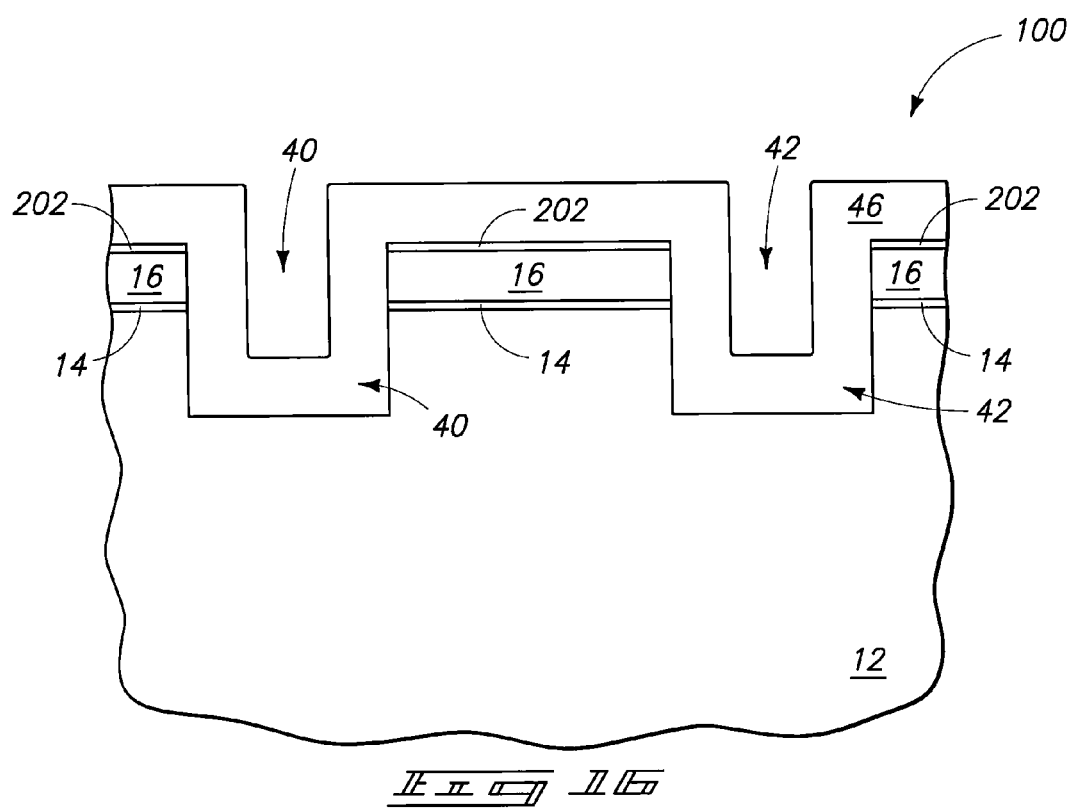
_Fig. 16_

METHODS OF FORMING SEMICONDUCTOR CONSTRUCTIONS

RELATED PATENT DATA

This patent resulted from a continuation application of U.S. patent application Ser. No. 11/402,659, filed Apr. 11, 2006, now U.S. Pat. No. 7,799,694 and entitled "Methods of Forming Semiconductor Constructions", naming Ramakanth Alapati et al. as inventors, the disclosure of which is incorporated herein by reference.

TECHNICAL FIELD

The invention pertains to methods of forming semiconductor constructions.

BACKGROUND OF THE INVENTION

Trenched isolation regions (such as, for example, shallow trench isolation regions) are commonly utilized in integrated circuitry for electrically isolating electrical components from one another. The isolation regions extend into a semiconductor substrate, and comprise insulative material formed within trenches that have been etched into the substrate.

A problem that can occur during formation of trenched isolation regions is that voids can become trapped in the trenches during deposition of the insulative material within the trenches. The voids will have dielectric properties different than that of the insulative material, and accordingly will alter the insulative properties of the isolation regions. In response to this problem, numerous technologies have been developed for eliminating void formation within trenched isolation regions.

It is becoming increasingly difficult to eliminate void formation with increasing levels of integration. Specifically, trenched isolation regions are becoming narrower and deeper with increasing levels of integration, which renders it more difficult to uniformly fill the trenched isolation regions with insulative material.

In light of the above-discussed difficulties, it would be desirable to develop new methods for fabrication of trenched isolation regions which alleviate problems associated with voids. Although the invention described herein was motivated, at least in part, by the desire to alleviate problems associated with void formation in trenched isolation regions, persons of ordinary skill in the art will understand upon reading this disclosure and the claims that follow that aspects of the invention can have applications beyond trenched isolation regions.

BRIEF DESCRIPTION OF THE DRAWINGS

Preferred embodiments of the invention are described below with reference to the following accompanying drawings.

FIG. 1 is a diagrammatic, cross-sectional view of a fragment of a semiconductor construction at a preliminary processing stage in accordance with an exemplary aspect of the present invention.

FIG. 2 is a view of the FIG. 1 wafer fragment shown at a processing stage subsequent to that of FIG. 1.

FIG. 7 is a view of the FIG. 1 wafer fragment shown at a processing stage subsequent to that of FIG. 6.

FIG. 8 is a view of the FIG. 1 wafer fragment shown at a processing stage subsequent to that of FIG. 7.

FIG. 11 is a view of the FIG. 1 wafer fragment shown at a processing stage subsequent to that of FIG. 10.

FIG. 12 is a top view of the wafer fragment at the processing stage of FIG. 11, with the cross-section of FIG. 11 being along the line 11-11.

FIG. 13 is a diagrammatic, cross-sectional view along the lines 13-13 of FIGS. 11 and 12. The cross-section of FIG. 11 is along the line 11-11 of FIG. 13.

FIG. 14 is a diagrammatic, cross-sectional view of a fragment of a semiconductor construction at a preliminary processing stage in accordance with another exemplary aspect of the present invention.

FIG. 15 is a view of the FIG. 14 wafer fragment shown at a processing stage subsequent to that of FIG. 14.

FIG. 16 is a view of the FIG. 14 wafer fragment shown at a processing stage subsequent to that of FIG. 15.

DETAILED DESCRIPTION OF THE PREFERRED EMBODIMENTS

Figure 3:
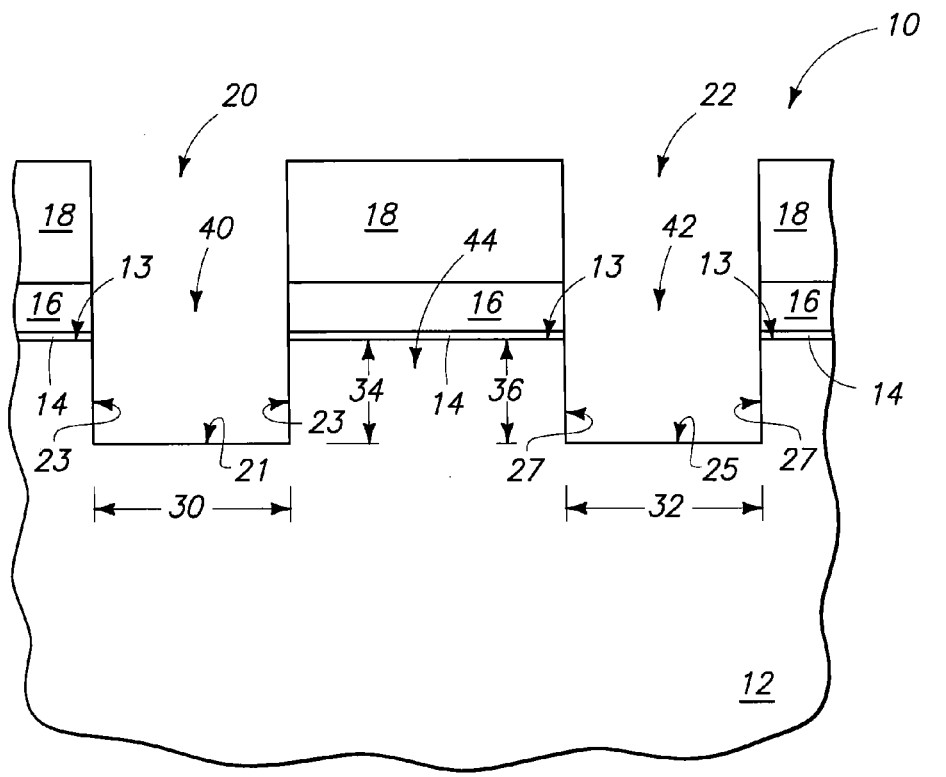
FIG. 3 is a view of the FIG. 1 wafer fragment shown at a processing stage subsequent to that of FIG. 2.

This disclosure of the invention is submitted in furtherance of the constitutional purposes of the U.S. Patent Laws "to promote the progress of science and useful arts" (Article 1, Section 8).

The invention includes trenched structures configured to trap voids in particular regions of the trenches. The voids can thus be uniformly and controllably incorporated into a plurality of trenched structures across a substrate. Accordingly, the invention includes aspects in which prior art problems associated with the voids are alleviated, not by eliminating the voids, but rather by developing structures which can control the locations of the voids.

Exemplary aspects of the invention are described with reference to FIGS. 1-19.

Referring to FIG. 1, a semiconductor fragment 10 is illustrated at a preliminary processing stage in accordance with an exemplary aspect of the present invention. The fragment 10 comprises a semiconductor substrate 12. Substrate 12 can comprise, consist essentially of, or consist of, for example, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Substrate 12 is shown to comprise a planar, or at least substantially planar, top surface 13.

Hard mask layers (which can alternatively be referred to as hard masking layers) 14 and 16 are formed over the top surface of substrate 12; with the layer 14 shown to be directly against the top surface 13 of substrate 12, and the layer 16 shown to be directly against the layer 14.

The layer 14 can, for example, comprise, consist essentially of, or consist of silicon oxide; and the layer 16 can, for example, comprise, consist essentially of, or consist of silicon nitride. Accordingly, the layers 14 and 16 can be referred to as a silicon oxide-containing layer and a silicon nitride-containing layer, respectively.

Although two hard mask layers are shown, it is to be understood that the invention also includes aspects in which only a single hard mask layer is utilized, in which no hard mask layers are utilized, or in which more than two hard mask layers are utilized.

Patterned photoresist 18 is formed over layer 16. The photoresist can be patterned by photolithographic processing. The patterned photoresist has openings 20 and 22 extending therethrough to expose regions of hard mask layer 16. The openings 20 and 22 can correspond to trenches extending longitudinally in a direction into and out of the page relative to the cross-sectional view of FIG. 1.

Referring to FIG. 2, openings 20 and 22 are transferred through mask layers 14 and 16 with one or more appropriate etches. The openings are shown to penetrate to, but not through, planarized upper surface 13 of substrate 12. It is to be understood, however, that the invention also includes aspects in which the openings penetrate into substrate 12 during the etching utilized to penetrate through the masking layers 14 and 16.

Referring to FIG. 3, openings 20 and 22 are extended into substrate 12 with an appropriate etch. In the shown aspect of the invention, such etching into the substrate occurs while photoresist 18 remains over mask layers 14 and 16, but it is to be understood that the invention also includes aspects in which photoresist 18 is removed after etching through one or more of the hard mask layers, and prior to any significant etching into the substrate 12. In some aspects, substrate 12 can correspond to monocrystalline silicon, and the etching of FIG. 3 can thus correspond to a silicon etch.

The etching into substrate 12 forms openings 40 and 42 (in some cases trenches) within the substrate. The openings 40 and 42 have bottoms (or bases) 21 and 25, respectively; and have sidewalls 23 and 27, respectively. The sidewalls extend from the bottoms to the top surface 13.

The openings 40 and 42 have widths 30 and 32, respectively, corresponding to distances between the sidewalls; and the openings 40 and 42 have depths 34 and 36, respectively, which correspond to the distance between the bottoms of the openings and the upper surface 13 of the substrate. The widths of the openings can be, for example, from about 5 nanometers to about 100 nanometers; in some aspects from about 7 nanometers to about 35 nanometers; and in some aspects from about from about 10 nanometers to about 100 nanometers. The depths of the openings can be, for example, from about 80 nanometers to about 400 nanometers; in some aspects from about 80 nanometers to about 150 nanometers; and in some aspects from about 100 nanometers to about 400 nanometers.

The openings formed within the substrate at the processing stage of FIG. 3 can be referred to as first openings to distinguish them from additional openings formed into the substrate at a subsequent processing stage (the additional openings are discussed below with reference to FIG. 6).

The formation of the openings 40 and 42 within the substrate leaves a mesa 44 of the substrate projecting upwardly between the openings. In some aspects, the openings 40 and 42 can be considered to be spaced from one another by the region of the substrate corresponding to mesa 44.

Figure 4:
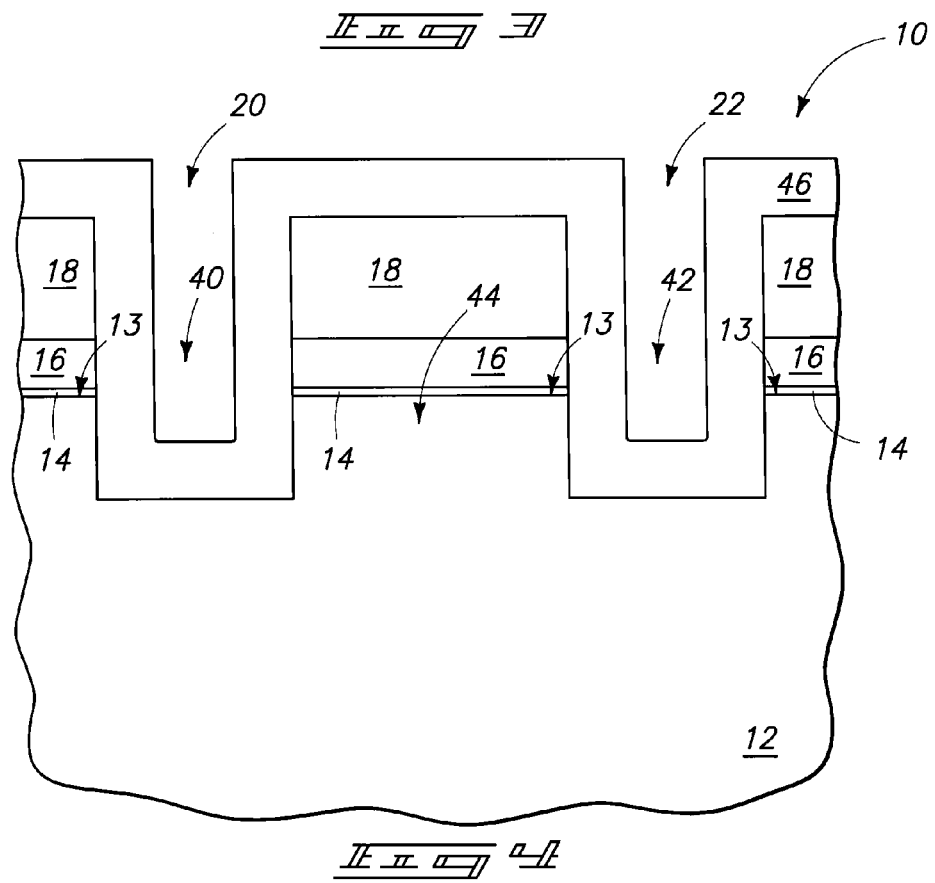
FIG. 4 is a view of the FIG. 1 wafer fragment shown at a processing stage subsequent to that of FIG. 3.

Referring to FIG. 4, a layer 46 is conformally formed over photoresist 18 and within openings 40 and 42. Layer 46 partially fills the openings, and accordingly defines a liner within the openings which narrows the openings. Layer 46 comprises carbon-containing material (in some aspects polymer), and can be referred to as a carbon-containing liner. In some aspects, layer 46 can predominantly comprise, consist essentially of, or consist of carbon.

Layer 46 can be formed by any suitable method. In particular aspects, the layer is formed by so-called gmode technology.

Initially, construction 10 is provided within a suitable reaction chamber, and then surfaces of the construction are exposed to a pre-deposition treatment with one or more of $C_2H_4$, $CH_4$, $CH_3F/N_2$, $CH_3F/CO$ and $C_2H_4/H_2$; at high pressure (typically a pressure of at least about 140 millitorr), and source power of from about 200 watts to about 1200 watts, with a source frequency of 2 MHz, 27 MHz or 60 MHz for a time of at least about 20 seconds (with a typical time being about 30 seconds).

Subsequently, and while the construction remains within the reaction chamber, formation of layer 46 is conducted utilizing alternating cycles of deposition and etch. Typically, three or more cycles of deposition/etch will be utilized to form the carbon-containing layer over the surfaces. The deposition can, for example, utilize one or more of $CH_3F/N_2$, $CH_3F/CO$, and $CH_3F/H_2$; and the etch can, for example, utilize one or both of $CF_4/Ar$ and $CH_3F/N_2$. In particular aspects, the initial treatment of the surfaces (discussed above) and the deposition components of the deposition/etch cycles will be conducted at a higher pressure than the etch components of the deposition/etch cycles. Also, the deposition components of the deposition/etch cycles can be conducted at lower substrate bias than the etch components of the deposition/etch cycles.

In an exemplary aspect, the deposition component of a deposition/etch cycle is conducted at a pressure of about 140 millitorr, with a source power of about 400 watts at about 27 MHz frequency, and for a time of at least about five seconds; and the etch component of the deposition/etch cycle is conducted at a pressure of about 40 millitorr, with a source power of about 800 watts at about 27 MHz frequency, and for a time that is at least about one second less than the time of the deposition component of the cycle. The deposition component of the deposition/etch cycle can utilize $CH_3F$ at a flow rate of about 150 standard cubic centimeters per minute (sccm), $N_2$ at a flow rate of about 75 sccm, and Ar at a flow rate of about 210 sccm, for a time of about 6 seconds. The etch component of the deposition/etch cycle can utilize $CF_4$ at a flow rate of about 75 sccm, for a time of about 4 seconds. In an exemplary application, the deposition/etch cycle is repeated 6 times, with each deposition component of each deposition/etch cycle being conducted for a time of about 12 seconds, and each etch component being conducted for a time of about 7 seconds.

The combination utilization of the above-discussed deposition/etch cycles can form layer 46 to have different properties along horizontal surfaces (such as over top surfaces of resist 18) than along vertical sidewall surfaces. In some aspects, the portion of layer 46 extending over horizontal top surfaces can be harder than the portion along sidewall surfaces; with the portion extending over top surfaces corresponding to one or both of graphite and diamond-like carbon, and the portion extending along sidewall surfaces corresponding to hydrocarbons or fluorocarbons. As is known to persons of ordinary skill in the art, graphite, diamond, hydrocarbons and fluorocarbons can all comprise repeating carbon-containing subunits.

Layer 46 can be formed to a thickness of, for example, from about 5 nanometers to about 50 nanometers; although preferred widths can vary depending on the width of opening 42.

Figure 5:
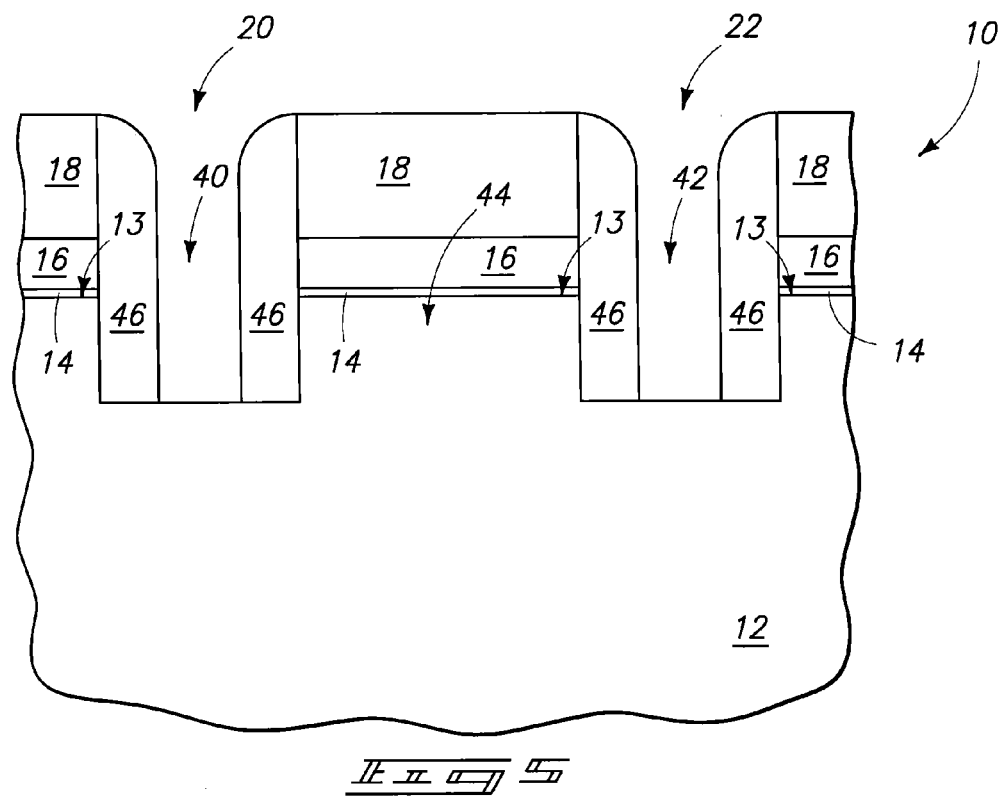
FIG. 5 is a view of the FIG. 1 wafer fragment shown at a processing stage subsequent to that of FIG. 4.

Referring to FIG. 5, liner 46 is subjected to an anisotropic etch which punches through the bottom of the liner to expose substrate 12 along the bottoms of the openings 40 and 42. The liner 46 remains along sidewalls of the openings so that it is only central regions of the bottoms of the openings which are exposed by the punch-through of the liner. The anisotropic etch of the liner can utilize any suitable chemistry, and in some aspects utilizes $CF_4/Ar$. For instance, the punch-through etch can utilize $CF_4$ at a flow rate of about 75 sccm, a pressure of about 40 millitorr, and a source power of about 400 watts at about 27 MHz, for a time about 20 seconds.

The punch-through etch can be conducted in the same reaction chamber as the deposition/etch cycle. In some aspects, the pre-treatment, deposition/etch cycles, and punch-through etch are all conducted in the same reaction chamber, and without breaking vacuum to the chamber from initiation of the pre-treatment until completion of the punch-through etch.

The shown punch-through etch is selective for liner 46 relative to substrate 12. The etch may also have some selectivity for liner 46 relative to photoresist 18, but typically such will be significantly less than the selectivity of the etch relative to substrate 12.

Figure 6:
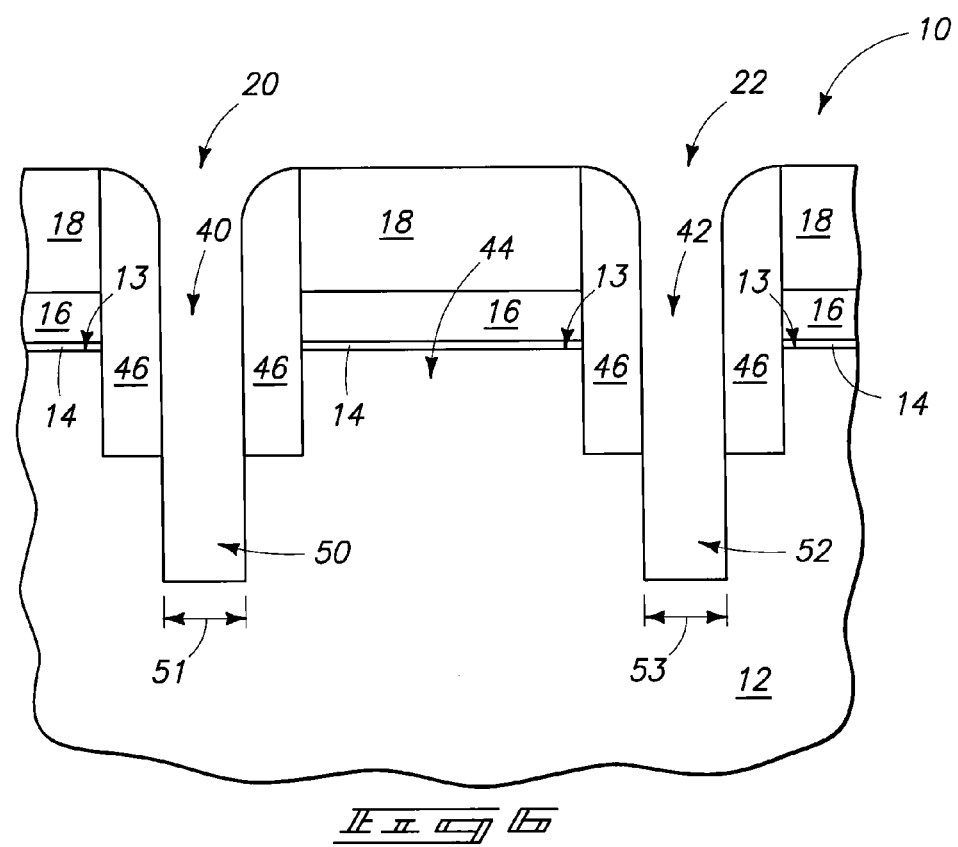
FIG. 6 is a view of the FIG. 1 wafer fragment shown at a processing stage subsequent to that of FIG. 5.

Referring to FIG. 6, the exposed regions of substrate 12 along the bases (or bottoms) of openings 40 and 42 are subjected to an etch which forms narrow openings 50 and 52 extending into substrate 12 from such bases. The openings 50 and 52 can be referred to as a second openings to distinguish them from the first openings 40 and 42. The openings 50 and 52 have widths 51 and 53 which are narrower than the widths 30 and 32 (FIG. 3) of the first openings. In particular aspects, widths 51 and 53 of the second openings can be less than or equal to about one-half of the widths of the first openings to which the second openings join.

The narrow openings 50 and 52 have bottoms (or bases), and sidewalls extending from the bottoms to the bases of the wide openings 40 and 42.

As mentioned above, the invention includes aspects in which openings 40 and 42 are trenches extending longitudinally into and out of the page relative to the cross-sectional views of the drawings. In such aspects, openings 50 and 52 can correspond to trenches which are narrower than the trenches 40 and 42 to which they join.

Referring to FIG. 7, photoresist 18 (FIG. 6) and remaining portions of liner 46 (FIG. 6) are removed. Such removal can be encompassed with any suitable etch, or combination of etches, and/or with ashing.

Referring next to FIG. 8, a substantially solid material 58 is deposited within openings 40, 42, 50 and 52, and over mask layers 14 and 16. The material fills wide openings 40 and 42, but leaves voids 60 and 62 within the narrow openings 50 and 52, respectively. Material 58 is referred to as being a "substantially solid" material to indicate that the material can be, but is not limited to, pure solids, but instead can also comprise gelatinous materials and other semi-solid materials including, for example, various glasses. The material 58 can comprise any suitable composition or combination of compositions, and although shown to be substantially homogeneous, can comprise multiple layers. In particular aspects, material 58 is an electrically insulative material suitable for formation of trenched isolation regions. In such aspects the material can, for example, comprise, consist essentially of, or consist of silicon dioxide. For example, material 58 can be silicon dioxide formed by high density plasma (HDP) deposition.

The narrow openings 50 and 52 are configured to at least substantially entirely retain the voids relative to the wide openings 40 and 42, with the term "substantially entirely retained within the narrow openings" meaning that the vast majority of the volume of a void is retained within a narrow opening rather than within the wide opening to which the narrow opening is joined. More specifically, such phrase means that at least about 75% of the volume of a void is retained within a narrow opening. In some aspects, the entirety of a void will be retained within the narrow opening. In other words, the entirety of the void will be at or below the elevational level of steps (in other words, the remaining portions of the bases of the wide openings) which join the narrow openings to the wide openings (exemplary steps are labeled 61 and 63 in FIG. 8).

In the shown aspect of the invention, the narrow openings have substantially vertical sidewalls, and similarly the wide upper openings have substantially vertical sidewalls. The steps 61 and 63 extend substantially perpendicularly to the substantially vertical sidewalls, and in some aspects can extend exactly perpendicularly to the substantially vertical sidewalls.

Utilization of perpendicularly-extending steps can provide clear delineation between the wide openings and the narrow openings joined thereto, which can assist in forcing the voids to be retained substantially entirely within the narrow openings. In contrast, utilization of steps having a very gradual slope between the narrow openings and the wide openings can create difficulty in controlling the location of the voids.

Figure 9:
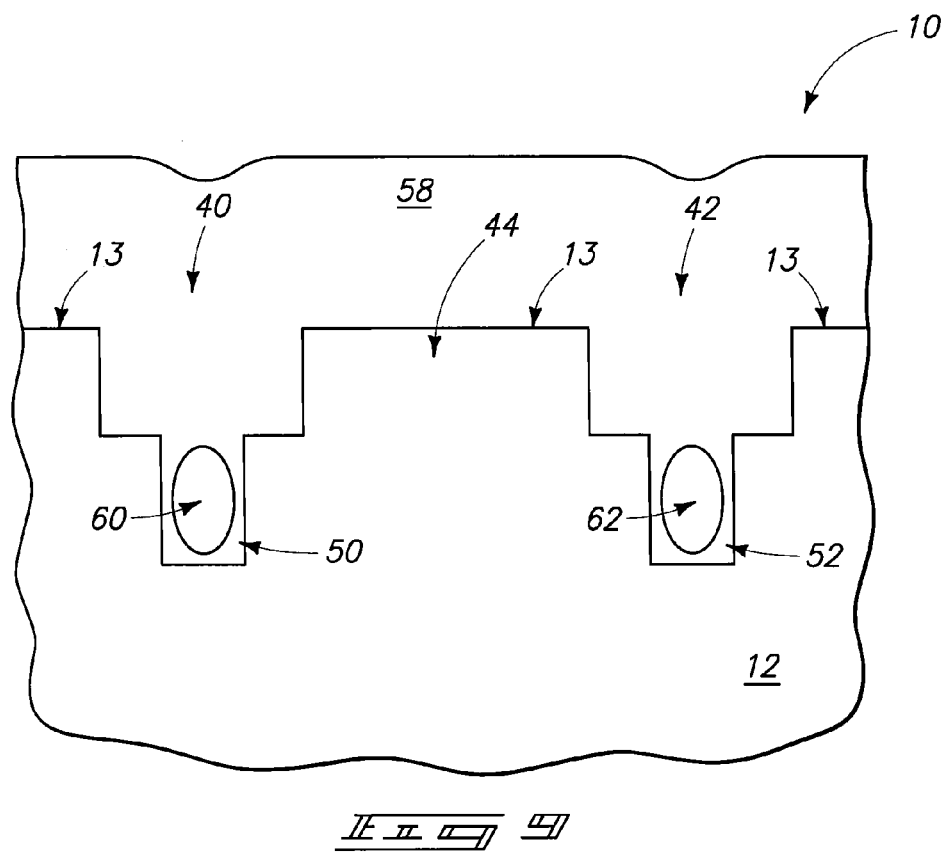
FIG. 9 is a view of the FIG. 1 wafer fragment shown at a processing stage subsequent to that of FIG. 7 in accordance with an aspect of the invention alternative to that of FIG. 8.

Although material 58 is formed over mask layers 14 and 16 in the aspect of the invention of FIG. 8, it is to be understood that the invention also encompasses aspects in which layers 14 and 16 are removed prior to formation of material 58. Such aspect is shown in FIG. 9. The removal of layers 14 and 16 can be accomplished by any suitable etch, and/or by planarization.

Figure 10:
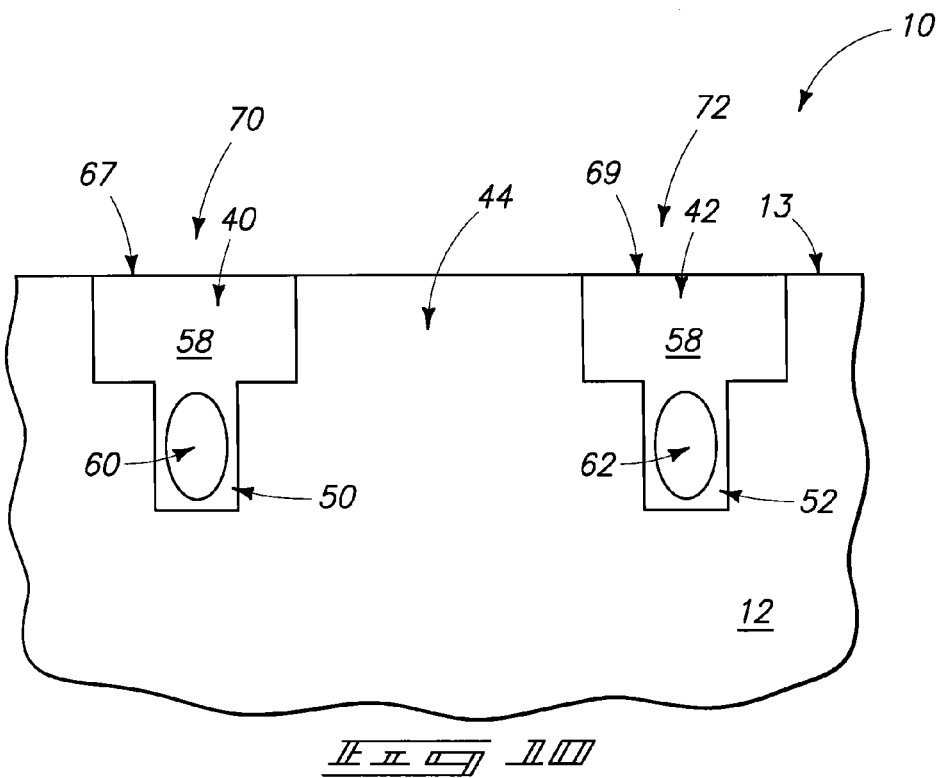
FIG. 10 is a view of the FIG. 1 wafer fragment shown at a processing stage subsequent to that of FIG. 8 or to that of FIG. 9.

Regardless of whether the aspect of FIG. 8 is utilized, or that of FIG. 9 is utilized, material 58 is subsequently subjected to planarization (such as, for example, chemical-mechanical polishing) to remove the material from over the substrate and form the structure of FIG. 10. If the aspect of FIG. 8 is utilized, such planarization will also remove mask layers 14 and 16 from over substrate 12. The planarization forms the shown planarized uppermost surfaces 67 and 69 of the material 58 across openings 40 and 42, respectively. Such planarized uppermost surfaces are co-planar with the uppermost surface 13 of substrate 12. In some aspects, some of substrate 12 can be removed during the planarization so that the planarized surface 13 of FIG. 8 (or FIG. 9) is not the same surface as the planarized surface 13 that existed prior to planarization material 58.

If the material 58 within openings 40, 42, 50 and 52 is electrically insulative, such material can form trenched isolation regions within the openings. In such aspects, the voids 60 and 62 can also be considered to be part of the trenched isolation regions. It can be advantageous to incorporate the voids into trenched isolation regions in that the voids will typically have very low dielectric constants, which can be desired for some applications of trenched isolation regions.

It is noted that the voids 60 and 62 will typically be filled with gas. If material 58 seals the voids from the atmosphere exterior of material 58, the particular gas within the voids can be the ambient present during deposition of material 58 at the processing stage of FIG. 8 (or FIG. 9), and/or gases formed by out-gassing from material 58 during deposition of the material. In some aspects of the invention, the material 58 can be referred to as a non-gaseous material to distinguish the material from the voids 60 and 62 extending therein.

The trenched isolation region formed within openings 40 and 50 can be referred to as a first trenched isolation region 70, and the trenched isolation region formed within openings 42 and 52 can be referred to as a second trenched isolation region 72. Any suitable circuitry can be formed proximate the trenched isolation regions to incorporate the trenched isolation regions into an integrated circuit construction. FIGS. 11-13 show a wordline 80 formed across isolation regions 70 and 72, and show a transistor device 90 incorporating a portion of the wordline as a transistor gate.

Referring to FIG. 11, the wordline 80 is shown to comprise a stack comprising dielectric material 82, conductive material 84, and an insulative cap 86. The dielectric material 82 can comprise any suitable gate dielectric, including, for example, silicon dioxide. In particular aspects, the dielectric material will comprise, consist essentially of, or consist of silicon dioxide. The conductive gate material 84 can comprise any suitable electrically conductive composition or combination of compositions; and in particular aspects will comprise, consist essentially of, or consist of one or more of conductively-doped semiconductor material (such as, conductively-doped silicon), metal (such as tungsten or titanium), and metal compounds (such as titanium silicide). The electrically insulative cap 86 can comprise any suitable composition or combination of compositions, and in particular aspects will comprise, consist essentially of, or consist of one or more of silicon dioxide, silicon nitride, and silicon oxynitride.

The wordline 80 extends across the trenched isolation regions 70 and 72, and also across the semiconductor substrate region 44 between the trenched isolation regions. The transistor construction 90 (which will be described in more detail below, and which is more clearly illustrated in FIGS. 12 and 13) is over and within the region 44 of semiconductor substrate 12. Accordingly, the semiconductor material of substrate 12 that is within region 44 and directly below the wordline 80 can be doped with an appropriate threshold voltage implant, as such is a channel region of a transistor device.

Referring to FIG. 12, such shows a top view of a fragment comprising the cross-section of FIG. 11, and shows that the materials 82, 84 and 86 are patterned as a line extending across the substrate 12 and the isolation regions 70 and 72. Such also shows that the isolation regions 70 and 72 are trenches extending substantially orthogonally to the direction of the wordline 80.

Referring to FIG. 13, such shows a cross-section through the fragment of FIG. 12, and orthogonal to the cross-section discussed above with reference to FIG. 11. The cross-section of FIG. 13 shows that the transistor device 90 comprises source/drain regions 92 and 94 extending into the semiconductor substrate 12 on opposing sides of the wordline 80. The cross-section of FIG. 13 also shows that sidewall spacers 96 and 98 are formed along sidewalls of the stacked materials 82, 84 and 86. Such sidewall spacers can be conventional spacers as utilized in the art along sidewalls of wordlines, and can comprise, for example, one or more of silicon dioxide, silicon nitride and silicon oxynitride.

The source/drain regions 92 and 94 of FIG. 13 extend into substrate 12 to a depth 100; and the void regions 60 and 62 of FIG. 11 are retained at or below a depth 102 within substrate 12. In other words, the void regions 60 and 62 have uppermost surfaces that are beneath the surface 13 of substrate 12 by a depth 102, and the source/drain regions have lowermost surfaces that are at the depth 100 within substrate 12. In some aspects of the invention, the depths of the voids can be such that the voids are entirely beneath the elevational level of the source/drain regions within substrate 12. In other aspects, the source/drain regions elevationally overlap the voids within substrate 12. The voids can be considered an insulative material that is part of the isolation regions 70 and 72. In some aspects it can be advantageous for the source/drain regions to overlap such insulative material corresponding to the voids, and in other aspects it can be advantageous if the source/drain regions do not elevationally overlap such insulative material.

The transistor device 90 can be utilized in numerous applications, including, for example, in memory cells. If the transistor device is utilized in memory cells, one of the source/drain regions 92 and 94 can be electrically coupled to a charge storage device, while the other is electrically coupled to a bitline. In the shown aspect of FIG. 13, the source/drain region 94 is electrically coupled to a charge storage device 110, while the source/drain region 92 is electrically coupled to a bitline 112. The charge storage device can be, for example, a capacitor. As will be recognized by persons of ordinary skill in the art, the combination of a transistor with a capacitor can be considered to correspond to a dynamic random access memory (DRAM) cell. Accordingly, the transistor device 90 can be incorporated into a memory cell. In some aspects of the invention, a plurality of such memory cells can be formed across a semiconductor substrate to form a memory array.

The transistor structure of FIGS. 11-13 is but one of many types of transistor structures that can be utilized in integrated circuitry. Other types of structures can include, for example, programmable read only memory (PROM) devices. As will be recognized by persons of ordinary skill in the art, PROM devices can utilize conductive gate material similar to the gate material 84 of FIGS. 11-13.

The aspect of the invention discussed above formed the carbon-containing liner 46 (FIGS. 4-6) over photoresist 18. The invention encompasses other aspects in which photoresist 18 is removed prior to formation of liner 46. Such aspects are discussed with reference to FIGS. 14-18. Similar numbering will be utilized in describing FIGS. 14-18 as was used above in describing FIGS. 1-13, where appropriate.

Referring to FIG. 14, a construction 200 is illustrated at a processing stage analogous to that of the construction 10 the of FIG. 1. The construction 200 comprises the substrate 12, hard mask layers 14 and 16, and patterned photoresist 18 discussed above with reference to FIG. 1. Further, the patterned photoresist 18 defines openings 20 and 22 as discussed above with reference to FIG. 1.

Construction 200 differs from the construction 10 of FIG. 1 in that construction 200 comprises a third hard mask layer 202 in addition to the hard mask layers 14 and 16. Hard mask layer 202 can, for example, comprise, consist essentially of, or consist of silicon dioxide. The third hard mask layer 202 can be provided to provide selectivity during a subsequent etch of silicon-containing substrate 12 (discussed below with reference to FIG. 17) that could be difficult to achieve if silicon nitride-containing layer 16 were exposed to the etching conditions rather than silicon oxide-containing layer 202.

Referring next to FIG. 15, openings 20 and 22 are extended through hard mask layers 14, 16 and 202, and into substrate 12. Also, photoresist 18 (FIG. 14) is removed. The openings can be extended through layers 14, 16 and 202, and into substrate 12, with any suitable etch or combination of etches. In particular aspects, the openings are extended through layers 14, 16 and 202, and the photoresist is then removed. Subsequently, the openings are extended into the substrate 12. The portions of the openings within substrate 12 can correspond identically to the wide openings 40 and 42 within the substrate that were discussed above with reference to FIG. 3.

Referring to FIG. 16, the carbon-containing liner 46 is formed within the openings to narrow the openings.

Figure 17:
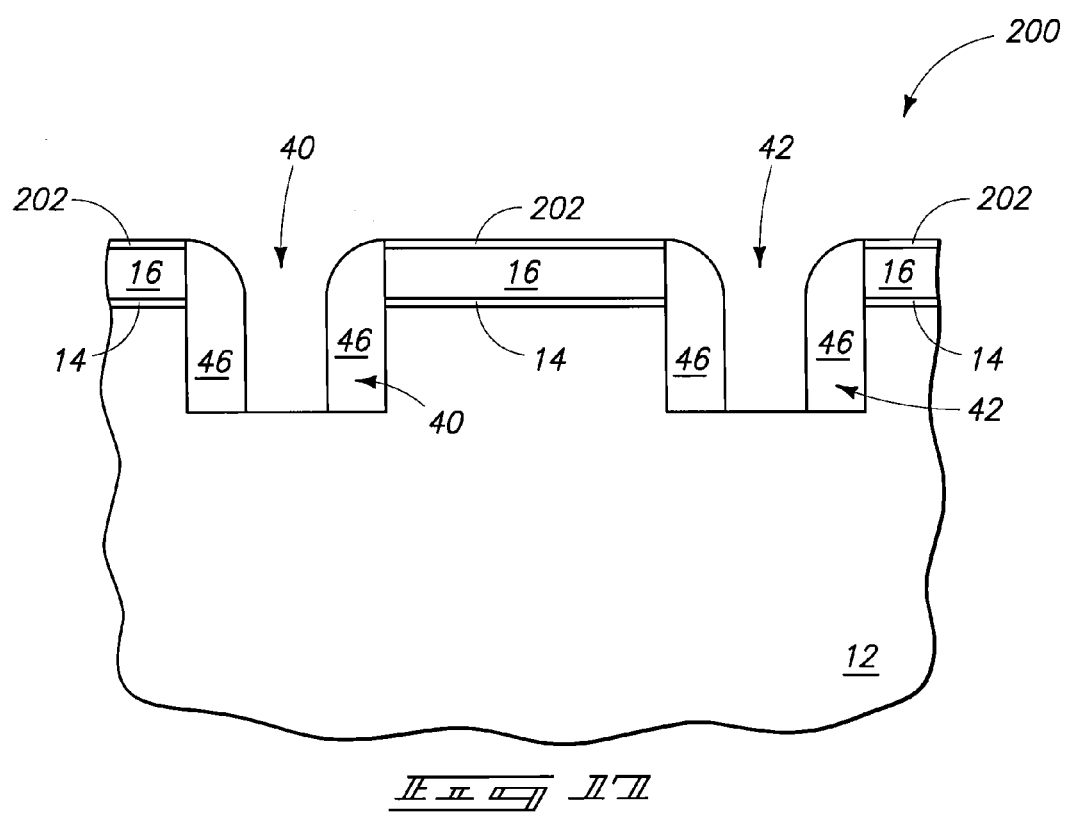
FIG. 17 is a view of the FIG. 14 wafer fragment shown at a processing stage subsequent to that of FIG. 16.

Referring to FIG. 17, the liner 46 is subjected to anisotropic etching to punch through the liner at the bottoms of openings 40 and 42, and to thus expose substrate 12 at the bottoms of such openings. The etch of liner 46 can be identical to the punch-through etch discussed above with reference to FIG. 5.

Figure 18:
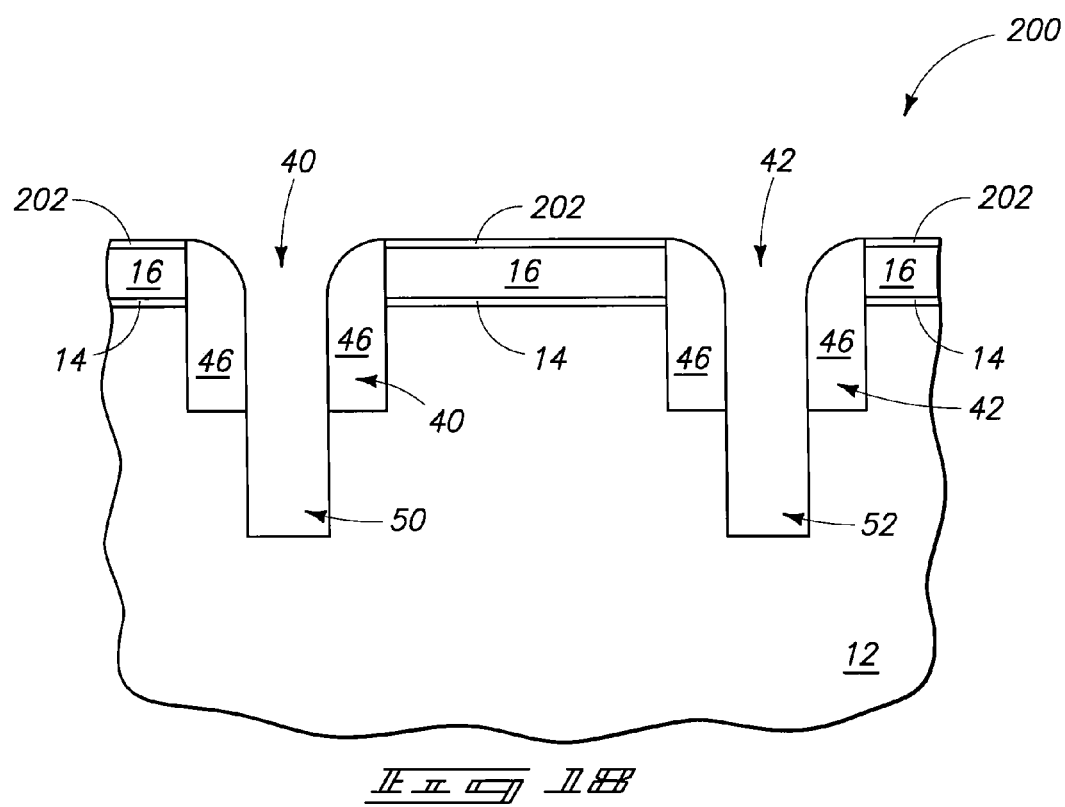
FIG. 18 is a view of the FIG. 14 wafer fragment shown at a processing stage subsequent to that of FIG. 17.

Referring to FIG. 18, substrate 12 is etched from the bottoms openings 40 and 42 to form narrow openings 50 and 52 extending into the substrate. In typical aspects, the substrate removed to form openings 50 and 52 will comprise, consist essentially of, or consist of monocrystalline silicon. The substrate can be removed with any suitable silicon etch. It is often difficult to selectively remove silicon relative to silicon nitride, but relatively easy to selectively remove the silicon relative to silicon dioxide. Accordingly, it can be advantageous to either not use silicon nitride materials for the hard mask layers, or, if silicon nitride materials are used, to protect such materials with an overlying layer of silicon dioxide. Accordingly, silicon dioxide-containing layer 202 is formed over silicon nitride-containing layer 16 in the shown aspect of the invention to protect the silicon nitride-containing layer during the silicon etch into substrate 12.

Figure 19:
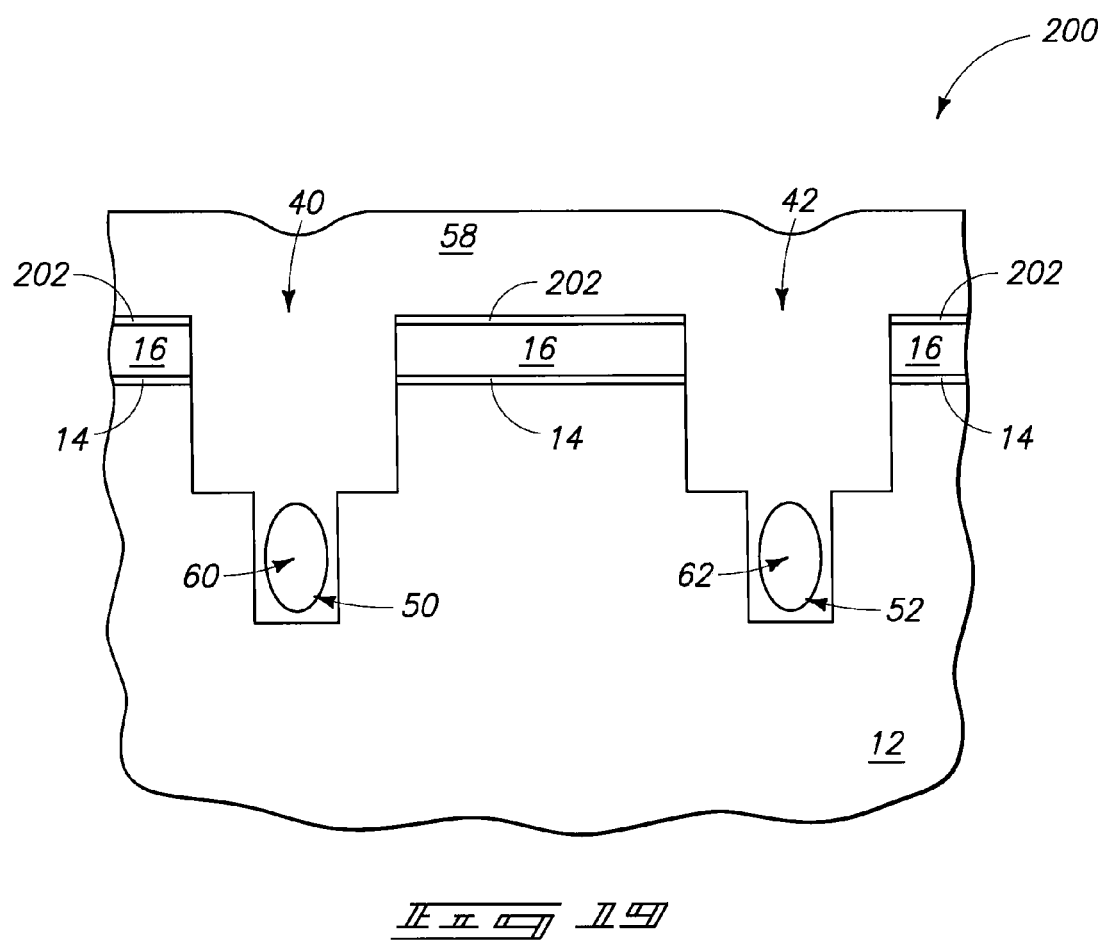
FIG. 19 is a view of the FIG. 14 wafer fragment shown at a processing stage subsequent to that of FIG. 18.

Referring next to FIG. 19, remaining portions of liner 46 (FIG. 18) are removed, and subsequently material 58 is formed within openings 40, 42, 50 and 52; with the material 58 substantially filling the openings and leaving voids 60 and 62 within narrowed openings 50 and 52. In some aspects of the invention (not shown) remaining portions of liner 46 can remain within the openings as material 58 is formed therein so that the portions of the liner and material 58 together substantially fill the openings. The construction of FIG. 19 can subsequently be subjected to planarization to form a construction identical to that discussed above with reference to FIG. 10.

In some aspects of the invention, the shape of the trenches (50 and 52 of FIG. 18) can be "engineered" to accommodate the trench profile suitable for the trench fill process, such as HDP, TEOS or SOD, and thus potentially eliminate the voids. For example, the shape of the spacer 46 can be formed with a slope; and/or while etching the trenches 50 and 52 a continuous polymer film can be deposited along the trench sidewalls, thereby making the sidewalls of trenches 50 and 52 less steep.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a semiconductor construction, the method comprising:
   providing a semiconductor substrate;
   forming a plurality of mask layers over the substrate;
   providing a first opening extending into the substrate and elevationally below the plurality of the mask layers over the substrate;
   forming a carbon-containing liner within the first opening, the forming comprising alternating a first method step with a separate second method step;
   removing a bottom portion of the liner to expose the substrate along a bottom of the first opening, and to leave a remaining portion of the liner along sidewalls of the first opening;
   forming a second opening extending downwardly into the substrate from the first opening which is narrower than the first opening and which joins to the first opening; and
   forming electrically insulative material within the first and second openings.

2. The method of claim 1 wherein the plurality of the mask layers comprises at least three discrete mask layers over the substrate.

3. The method of claim 1 wherein the plurality of the mask layers comprises at least two discrete mask layers over the substrate, the at least two discrete mask layers comprising the same material.

4. The method of claim 1 further comprising, before forming the electrically insulative material, removing the plurality of the mask layers from over the substrate.

5. The method of claim 1 wherein the plurality of the mask layers comprises at least two discrete mask layers over the substrate, the at least two discrete mask layers being spaced from each other.

6. The method of claim 1 further comprising:
   forming photoresist over the plurality of the mask layers; and
   removing the photoresist from over the plurality of the mask layers before the forming of the carbon-containing liner.

7. The method of claim 1 wherein the first method step comprises utilizing a first chemistry and wherein the second method step comprises utilizing a second chemistry different from the first chemistry.

8. The method of claim 1 wherein the first method step comprises using a first set of processing parameters and wherein the second method step comprises using a second set of processing parameters different from the first set of processing parameters.

9. A method of forming a semiconductor construction, the method comprising:
   providing a semiconductor substrate;
   forming a first opening extending into the substrate, the first opening having a first width;
   forming a carbon-containing liner within the first opening, the forming comprising alternating a first method step with a separate second method step;
   forming a second opening extending downwardly into the substrate through a bottom portion of the liner and through a bottom portion of the first opening, the second opening having a second width which is less than the first width; and
   forming electrically insulative material within the first and second openings, the electrically insulative material substantially filling the first opening and leaving a void within the second opening.

10. The method of claim 9 wherein the void is filled with gas.

11. The method of claim 9 wherein the void is filled with ambient gas present during the forming of the electrically insulative material.

12. The method of claim 9 further comprising out-gassing material from the electrically insulative material into the void.

13. The method of claim 9 wherein the first method step comprises utilizing a first chemistry and wherein the second method step comprises utilizing a second chemistry different from the first chemistry.

14. The method of claim 9 wherein the first method step comprises using a first set of processing parameters and wherein the second method step comprises using a second set of processing parameters different from the first set of processing parameters.

15. A method of forming a semiconductor construction, the method comprising:
    providing a semiconductor substrate comprising an upper surface;
    forming an opening extending into the substrate through the upper surface, the opening comprising sidewalls;
    forming a carbon-containing liner over the upper surface of the substrate and along the sidewalls of the opening, portions of the liner over the upper surface of the substrate comprising different properties relative portions of the liner along the sidewalls of the opening;
    wherein one of the properties comprises hardness, and wherein the portions of the carbon-containing liner over the upper surface of the substrate is harder than the portions of the carbon-containing liner along the sidewalls of the opening; and
    wherein the hardness of the portions of the carbon-containing liner over the upper surface of the substrate correspond to a hardness represented by at least one of graphite and diamond-like carbon.

16. The method of claim 15 wherein the hardness of the portions of the carbon-containing liner along the sidewalls of the opening correspond to a hardness represented by at least one of hydrocarbon and fluorocarbon.

17. The method of claim 15 wherein the opening comprises a first opening having a first width, and further comprising forming a second opening extending downwardly into the substrate through a bottom portion of the liner and through a bottom portion of the first opening, the second opening having a second width which is less than the first width.

18. The method of claim 15 wherein the sidewalls of the opening comprise vertical sidewalls.

19. The method of claim 15 further comprising, while leaving some of the portions of the liner along the sidewalls of the opening, forming electrically insulative material within the opening.

20. A method of forming a semiconductor construction, the method comprising:
    providing a semiconductor substrate;
    forming a plurality of mask layers over the substrate;
    providing a first opening extending into the substrate and elevationally below the plurality of the mask layers over the substrate;
    forming a carbon-containing liner within the first opening;
    removing a bottom portion of the liner to expose the substrate along a bottom of the first opening, and to leave a remaining portion of the liner along sidewalls of the first opening;
    forming a second opening extending downwardly into the substrate from the first opening which is narrower than the first opening and which joins to the first opening;
    forming electrically insulative material within the first and second openings; and
    wherein the plurality of the mask layers comprises at least two discrete mask layers with one of the two mask layers being a topmost layer over the substrate, the topmost layer comprising silicon oxide-containing material.

* * * * *